United States Patent
Yang et al.

(10) Patent No.: US 8,329,597 B2
(45) Date of Patent: Dec. 11, 2012

(54) SEMICONDUCTOR PROCESS HAVING DIELECTRIC LAYER INCLUDING METAL OXIDE AND MOS TRANSISTOR PROCESS

(75) Inventors: Chan-Lon Yang, Taipei (TW);
Shih-Fang Tzou, Hsinchu County (TW);
Chen-Kuo Chiang, Tainan (TW)

(73) Assignee: United Microelectronics Corp.,
Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/041,451

(22) Filed: Mar. 7, 2011

(65) Prior Publication Data
US 2012/0231600 A1    Sep. 13, 2012

(51) Int. Cl.
*H01L 21/31*    (2006.01)
(52) U.S. Cl. ............... 438/785; 438/778; 257/E21.282
(58) Field of Classification Search .................. 438/635, 438/926; 257/E21.282, E21.283, E21.284, 257/E21.4, E21.457
See application file for complete search history.

(56) References Cited

U.S. PATENT DOCUMENTS

| 6,803,275 | B1* | 10/2004 | Park et al. ...................... 438/257 |
| 7,030,430 | B2 | 4/2006 | Doczy |
| 7,488,656 | B2 | 2/2009 | Cartier |
| 2003/0057432 | A1* | 3/2003 | Gardner et al. ................ 257/100 |
| 2005/0037630 | A1* | 2/2005 | Doh et al. ...................... 438/785 |
| 2005/0275035 | A1 | 12/2005 | Mathew |
| 2006/0246740 | A1* | 11/2006 | Cartier et al. .................. 438/778 |
| 2009/0308636 | A1* | 12/2009 | Chudzik et al. .............. 174/126.4 |
| 2011/0256682 | A1* | 10/2011 | Yu et al. ........................ 438/287 |

* cited by examiner

*Primary Examiner* — Cheung Lee
(74) *Attorney, Agent, or Firm* — Winston Hsu; Scott Margo

(57) ABSTRACT

A semiconductor process having a dielectric layer including metal oxide is provided. The semiconductor process includes: A substrate is provided. A dielectric layer including metal oxide is formed on the substrate, wherein the dielectric layer has a plurality of oxygen-related vacancies. A first oxygen-importing process is performed to fill the oxygen-related vacancies with oxygen. Otherwise, three MOS transistor processes are also provided, each of which has a gate dielectric layer including a high dielectric constant, and a first oxygen-importing process is performed to fill the oxygen-related vacancies with oxygen.

17 Claims, 6 Drawing Sheets

SEMICONDUCTOR PROCESS HAVING DIELECTRIC LAYER INCLUDING METAL OXIDE AND MOS TRANSISTOR PROCESS

BACKGROUND OF THE INVENTION

1. Field of the Invention

The present invention relates generally to a semiconductor process and three MOS transistor processes, and more specifically, to a semiconductor process having a dielectric layer including metal oxide and three MOS transistor processes including a gate dielectric layer having a high-k dielectric constant.

2. Description of the Prior Art

Poly-silicon is conventionally used as a gate electrode in semiconductor devices, such as the metal-oxide-semiconductor (MOS). However, with a trend toward scaling down the size of semiconductor devices, the conventional poly-silicon gate has faced problems such as inferior performance due to boron penetration and an unavoidable depletion effect which increases the equivalent thickness of the gate dielectric layer, reduces gate capacitance, and worsens a driving force of the devices. Therefore, work function metals have been used to replace the conventional poly-silicon gate, to be the control electrodes suitable for use as the high-K gate dielectric layer.

A gate dielectric layer having a high-k dielectric constant (High-K) directly formed on the substrate or formed on the substrate through a buffer layer often entrains some gases or bonding such as vapor, hydrogen-oxygen bonding etc., which is either not needed, or actually worsens the performance of semiconductor elements. Furthermore, a more serious problem is that oxygen-related vacancies, which trap charges, occur because of oxygen particles in the gate dielectric layer breaking away from the gate dielectric layer, giving rise to the equivalent thickness of the gate dielectric layer increasing and the threshold voltage shifting. This reduces the electrical performance of the transistors.

SUMMARY OF THE INVENTION

The present invention provides a semiconductor process having a dielectric layer including metal oxide and three MOS transistor processes including a gate dielectric layer having a high-k dielectric constant. These processes can fill the oxygen-related vacancies of the dielectric layer with oxygen by applying an oxygen-importing process, therefore reducing the equivalent thickness of the gate dielectric layer and increasing the electrical quality.

The present invention provides a semiconductor process having a dielectric layer including metal oxide. The process comprises the following steps: a substrate is provided. A dielectric layer including metal oxide is formed on the substrate, wherein the dielectric layer has a plurality of oxygen-related vacancies. A first oxygen-importing process is performed to fill the oxygen-related vacancies with oxygen.

The present invention provides a MOS transistor process, which comprises the following steps: a substrate is provided. A gate dielectric layer having a high-k dielectric constant is formed on the substrate, wherein the gate dielectric layer has a plurality of oxygen-related vacancies. A first oxygen-importing process is performed to fill the oxygen-related vacancies with oxygen. A metal gate is formed on the gate dielectric layer.

The present invention provides a MOS transistor process, which comprises the following steps: a substrate is provided. A sacrificed gate structure is formed on the substrate. A spacer is formed beside the sacrificed gate structure. The sacrificed gate structure is removed to form a recess. A gate dielectric layer having a high-k dielectric constant is filled in the recess, wherein the gate dielectric layer has a plurality of oxygen-related vacancies. A first oxygen-importing process is performed to fill the oxygen-related vacancies with oxygen. A metal gate is filled in the recess.

According to the above, the present invention provides a semiconductor process and MOS transistor processes formed by applying the semiconductor process. The semiconductor process includes a dielectric layer having a high-k dielectric constant (for instance, a dielectric layer having metal oxide), and the dielectric layer has a plurality of oxygen-related vacancies. The present invention provides an oxygen-importing process performed in the semiconductor process to fill the oxygen-related vacancies with oxygen for resolving the problem of the increasing equivalent dielectric layer thickness, therefore reducing the threshold voltage and improving the electrical quality. Additionally, the present invention provides a degas process performed before the oxygen-importing process to further remove unnecessary gases and bonding such as vapor, hydrogen-oxygen bonding etc. in the dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
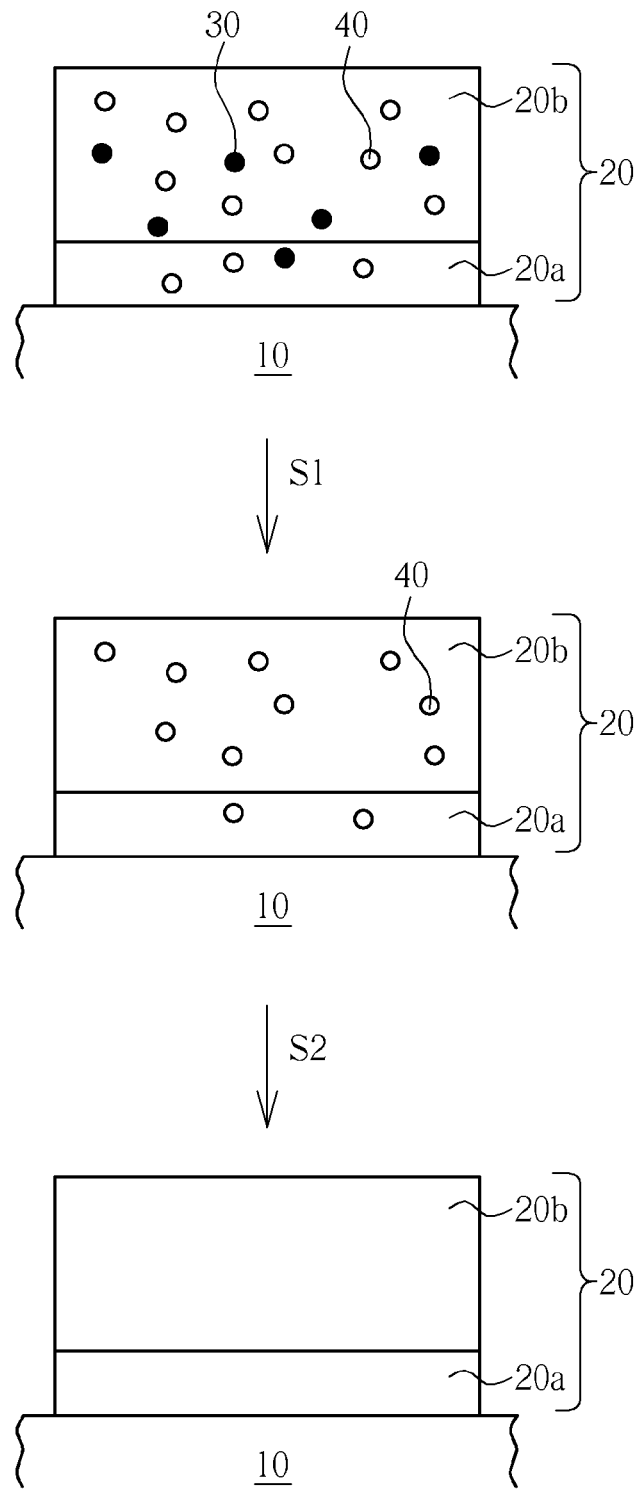
FIG. 1 schematically depicts a semiconductor process according to one preferred embodiment of the present invention.

FIG. 1 schematically depicts a semiconductor process according to one preferred embodiment of the present invention. Referring to FIG. 1, a substrate 10 is provided, which may be a semiconductor substrate such as a silicon substrate, a silicon-containing substrate or a silicon-on-insulator (SOI)

substrate. A dielectric layer 20 is formed on the substrate 10. In this embodiment, the dielectric layer 20 is a gate dielectric layer, but is not limited thereto, wherein the dielectric layer 20 may be a stack structure with a single layer or multilayered. In this embodiment, the dielectric layer 20 includes a first dielectric layer 20a and a second dielectric layer 20b. The second dielectric layer 20b may be a dielectric layer having a high-k dielectric constant. For instance, the second dielectric layer 20b may be metal oxide, such as hafnium oxide, zirconium oxide, but is not limited thereto. Furthermore, the second gate dielectric layer 20 may be composed of hafnium oxide ($HfO_2$), zirconium oxide ($ZrO_2$), hafnium zirconium oxide (HfZrO), hafnium aluminum oxide (HfAlO), hafnium lanthanum oxide (HfLaO), hafnium silicon oxide (HfSiO), hafnium silicon oxynitride (HfSiON), aluminum oxide (AlO), lanthanum oxide (LaO), lanthanum aluminum oxide (LaAlO), tantalum oxide (TaO), zirconium oxide (ZrO), or zirconium silicon oxide (ZrSiO). The first dielectric layer 20a may be a silicon dioxide layer, silicon oxynitride (SiON) etc. used as a part of the composite dielectric layer 20, or a buffer layer for the second dielectric layer 20b having a high-k dielectric constant formed thereon, but is not limited thereto. It is worthy of note that, due to facts such as current process control and material characteristics, the dielectric layer 20 will have a plurality of intrinsic defects, such as oxygen-related vacancies, gases like vapor, bonding like hydrogen-oxygen bonding or etc., resulting in the increasing equivalent dielectric layer thickness which shifts the threshold voltage and worsens the electrical quality of semiconductors. Therefore, the present invention provides an oxygen-importing process to solve these problems.

As shown in FIG. 1, the first dielectric layer 20a and the second dielectric layer 20b have a plurality of vapor, hydrogen-oxygen bonding 30 and oxygen-related vacancies 40. The first dielectric layer 20a and the second dielectric layer 20b may also include other gases or defects, which are not described herein. A degas process S1 is selectively performed in the present invention to remove impurities such as vapor and hydrogen-oxygen bonding 30 in the first dielectric layer 20a and the second dielectric layer 20b. Preferably, the degas process S1 is performed at a lower pressure (dozens of mTorr) and a lower temperature(150~250° C.) with a longer time, for helping degas and avoiding the thickness of the first dielectric layer 20a from being thicker caused by high processing temperature. After the degas process S1 is performed, although the impurities such as vapor and hydrogen-oxygen bonding 30 in the first dielectric layer 20a and the second dielectric layer 20b are removed, there are still a plurality of oxygen-related vacancies 40 caused by the oxygen-related broken bonding in the dielectric layer 20, wherein the oxygen-related vacancies 40 would trap charges while the semiconductor is operating and thereby reduce the electrical quality. Thus, a first oxygen-importing process S2 is sequentially performed to fill the oxygen-related vacancies 40 with oxygen, so as to reduce the defects in the dielectric layer 20 and improve the electrical quality.

In this embodiment, the first oxygen-importing process includes an oxygen-importing annealing process, wherein regrowth of the first dielectric layer 20a can be controlled by adjusting the annealing temperature of the oxygen-importing annealing process and the concentration of oxygen imported in the oxygen-importing annealing process. In a preferred embodiment, the annealing temperature of the oxygen-importing annealing process is under a temperature of 700° C. In another preferred embodiment, the annealing temperature of the oxygen-importing annealing process is in the range of 400° C.~500° C. and the concentration of the oxygen imported in the oxygen-importing annealing process is in the range of 10%~20%. Moreover, before the oxygen-importing annealing process is performed, an inert gas-importing annealing process such as an ammonia-importing annealing process, a nitrogen-importing annealing process, an argon-importing annealing process or other inert gas-importing annealing process is performed. In one case, the annealing temperature of the inert gas-importing annealing process is in the range of 700° C.~900° C., but the inert gas-importing annealing process may be performed at another annealing temperature. The purpose of performing the inert gas-importing annealing process is to help remove unnecessary impurities and bonding and re-crystallize the dielectric layer 20 to reduce defects at a higher annealing temperature.

In another embodiment, the first oxygen-importing process S2 may include an oxygen-implanting process to implant oxygen into the oxygen-related vacancies of the dielectric layer 20. Moreover, in one preferred embodiment, due to the temperature during the oxygen-implanting process operating not reaching a predetermined temperature as in the annealing process, performing the oxygen-implanting process cannot help to remove gases or defects. Therefore, performing a degas process S1 is needed to remove vapors, hydrogen-oxygen bonding or other gases in the dielectric layer 20 before the oxygen-implanting process is performed. In still another embodiment, the first oxygen-importing process may also be a chemical oxide removal process (COR), for instance, using a dry or wet oxygen-containing chemical solution, but is not limited thereto.

The first oxygen-importing process S2 is performed after the dielectric layer 20 is formed in this embodiment. However, in another not shown embodiment, a second oxygen-importing process may be performed after the first dielectric layer 20a is formed, and then the first oxygen-importing process S2 is performed after the second dielectric layer 20b is formed, wherein the words "first" and "second" are names for distinguishing between processes rather than defining an order of performance. The first oxygen-importing process S2 and the second oxygen-importing process may include an oxygen-importing annealing process, an oxygen-implanting process, etc., and the first oxygen-importing process S2 and the second oxygen-importing process may be the same process or different processes. Moreover, a degas process S1 can be respectively performed before the first and second oxygen-importing processes are performed to help remove the impurities and gases in the first dielectric layer 20a and the second dielectric layer 20b.

Furthermore, the semiconductor process provided in the present invention can be applied to MOS transistors. There are three MOS transistors processes that apply the semiconductor process as provided below, which are a gate first process, a gate last for high-k first process and a gate last for high-k last process. The semiconductor process provided in the present invention may also be applied to other MOS transistor processes and other semiconductor elements including dielectric layers having metal oxide, for instance a metal insulator metal (MIM) capacitor, but are not limited thereto.

In order to simplify and specify the present invention, symbols S1 and S2 of the degas process S1 and the first oxygen-importing process S2 applied in the said semiconductor process are also used in the following description of the MOS transistor processes for representing the same processes.

Figure 2A:
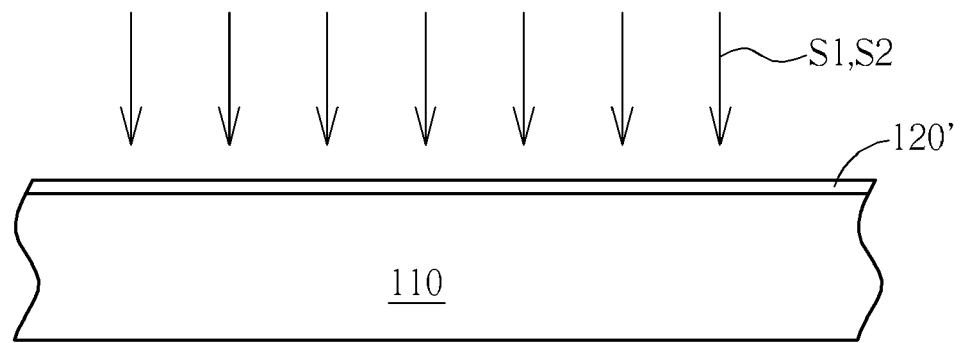
FIG. 2A schematically depicts a cross-sectional view of a MOS transistor process according to a first preferred embodiment of the present invention.
Figure 2B:
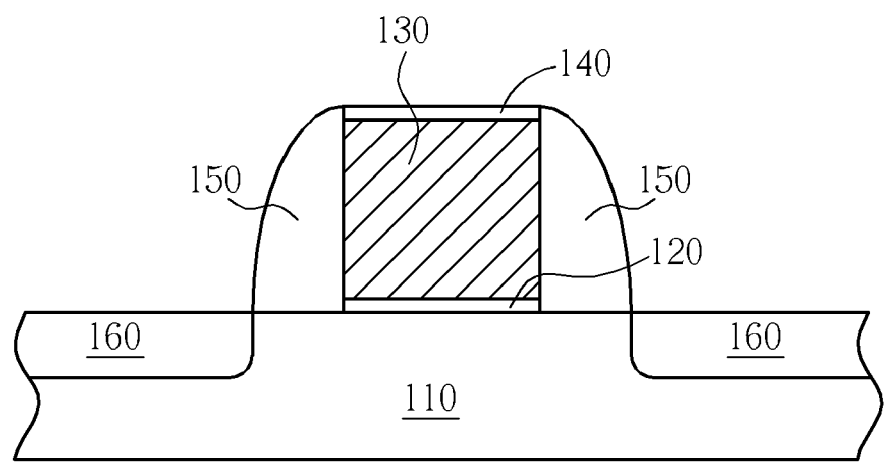
FIG. 2B schematically depicts a cross-sectional view of a MOS transistor process according to the first preferred embodiment of the present invention.

FIG. 2A-2B schematically depict a cross-sectional view of a MOS transistor process according to a first preferred embodiment of the present invention. Referring to FIG.

2A-2B, a substrate 110 is provided, and a dielectric layer 120' is formed on the substrate 110 (as shown in FIG. 2A), wherein the dielectric layer 120' may be a stack structure with single or multi layer. For example, the dielectric layer 120' may include a buffer layer and a dielectric layer having a high-k dielectric constant including metal oxide as shown in FIG. 1, and the dielectric layer 120' has impurities and defects such as vapor, bonding and oxygen-related vacancies (not shown). Thus, at least a degas process S1 is selectively performed in this embodiment to remove the impurities and defects in the dielectric layer 120' and then at least a first oxygen-importing process S2 is performed to fill the oxygen-related vacancies with oxygen for filling up the defects, wherein the materials, processes, and operating environments are identical to those applied in the semiconductor process of FIG. 1, and therefore are not described herein.

As shown in FIG. 2B, a metal layer (not shown) such as aluminum (Al) or other metals is formed on the dielectric layer 120'. A cap layer (not shown) is selectively formed on the metal layer. A photo-etching process is applied to pattern the cap layer and then the patterned cap layer 140, the metal gate 130 and the gate dielectric layer 120 can be sequentially formed. The spacer 150 with single or multi composite structure is formed beside the gate dielectric layer 120 and the metal gate 130. An ion implantation process and junction activation annealing process etc. are performed to form a source/drain region 160 next to the spacer 150 (as shown in FIG. 2B). In this embodiment, a silicon epitaxial process may be selectively performed and a metal silicide process, a contact etch stop layer (CESL) process etc. may be preformed on the source/drain region 160, meaning the MOS transistor process in the first embodiment of this invention is finished, wherein the gate first process is applied in the MOS transistor process.

Figure 3A:
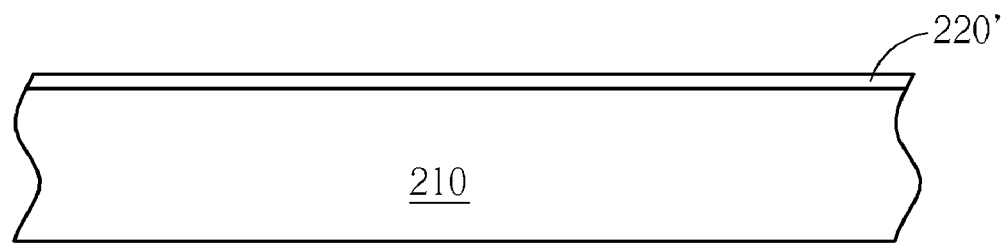
FIG. 3A schematically depicts a cross-sectional view of a MOS transistor process according to a second preferred embodiment of the present invention.
Figure 3B:
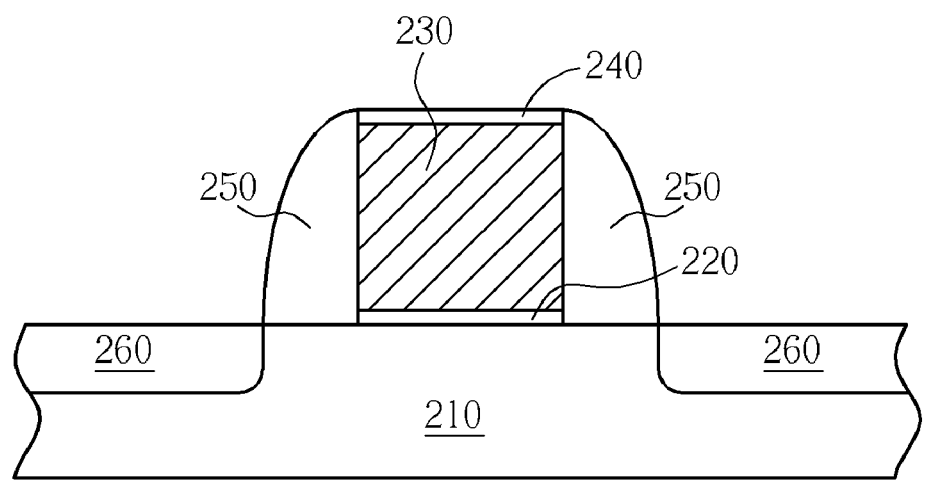
FIG. 3B schematically depicts a cross-sectional view of a MOS transistor process according to the second preferred embodiment of the present invention.
Figure 3C:
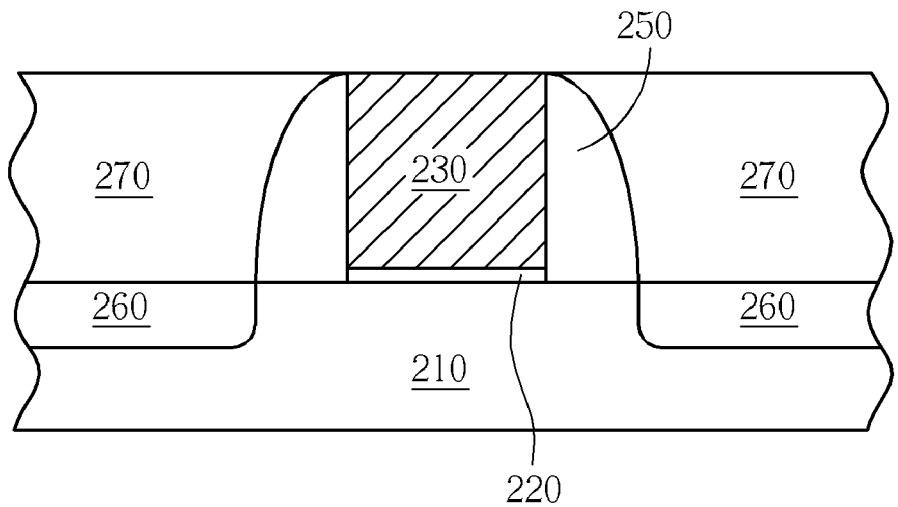
FIG. 3C schematically depicts a cross-sectional view of a MOS transistor process according to the second preferred embodiment of the present invention.
Figure 3D:
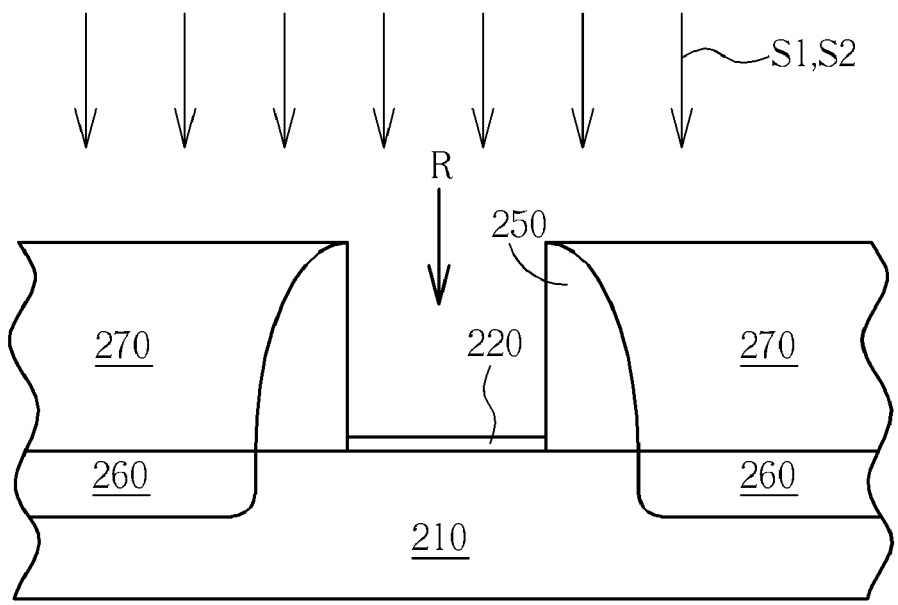
FIG. 3D schematically depicts a cross-sectional view of a MOS transistor process according to the second preferred embodiment of the present invention.
Figure 3E:
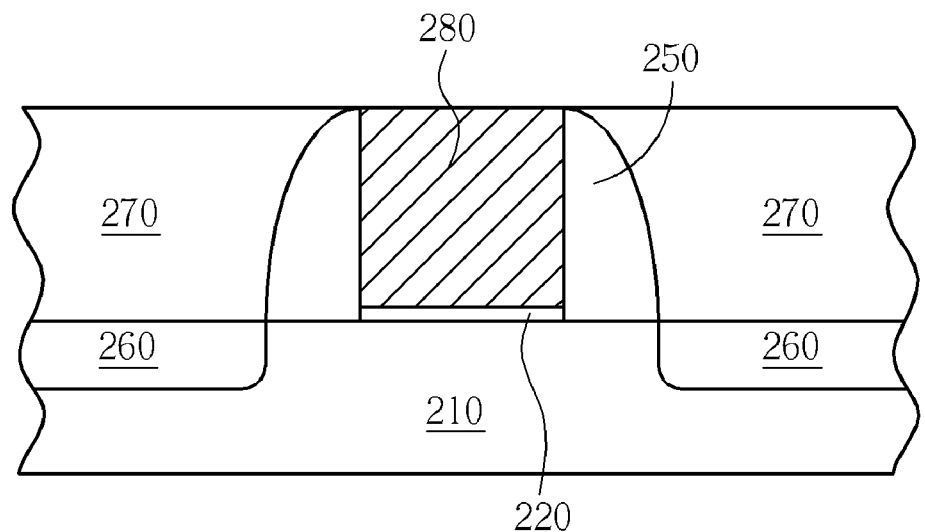
FIG. 3E schematically depicts a cross-sectional view of a MOS transistor process according to the second preferred embodiment of the present invention.

FIG. 3A-3E schematically depict a cross-sectional view of a MOS transistor process according to a second preferred embodiment of the present invention. Referring to FIG. 3A-3E, a substrate 210 is provided. A dielectric layer 220' having a high-k dielectric constant is formed on the substrate 210, wherein the dielectric layer 220' may be metal oxide (as shown in 3A) and a buffer layer may be selectively contained. A silicon layer (not shown), a polycrystalline silicon layer for instance, is formed in the dielectric layer 220'. A cap layer (not shown) is selectively formed on the silicon layer. A photo etching process is performed to pattern the cap layer for sequentially form a patterned cap layer 240, a silicon gate electrode 230 and a gate dielectric layer 220. In this embodiment, the silicon gate electrode 230 and the cap layer 240 are used as a sacrificed gate structure. A spacer 250 with single or multi composite structure is formed beside the gate dielectric layer 220, the silicon gate electrode 230 and the cap layer 240. An ion implantation process and junction activation annealing process etc. are performed to form a source/drain region 260 by using the spacer 250 as a hard mask (as shown in 3B). A dielectric layer 270 is formed to conformally cover the substrate 210, the cap layer 240 and the spacer 250. The cap layer 240 is removed by applying methods such as a chemical mechanical polishing process (CMP) to expose the silicon gate electrode 230 (as shown in 3C). The silicon gate electrode 230 is removed by an etching process, for example dry etching process or wet etching process, to form a recess R and expose the gate dielectric layer 220. A degas process S1 is selectively performed to remove impurities and bonding in the gate dielectric layer 220 and a first oxygen-importing process S2 is performed to fill the oxygen-related vacancies (not shown) of the gate dielectric layer 220 with oxygen (as shown in FIG. 3D). Finally, conductive materials such as work function metal layers or low resistance metal layers fill in the recess R and a metal gate 280 is formed on the gate dielectric layer 220 by applying a polishing process (as shown in FIG. 3E). In this embodiment, a silicon epitaxial process is selectively performed and a metal silicide process, a contact etch stop layer (CESL) process etc. may be performed on the source/drain region 260. That is, the MOS transistor in the second embodiment of the present invention is finished, wherein the gate last for high-k first is applied therein.

Figure 4A:
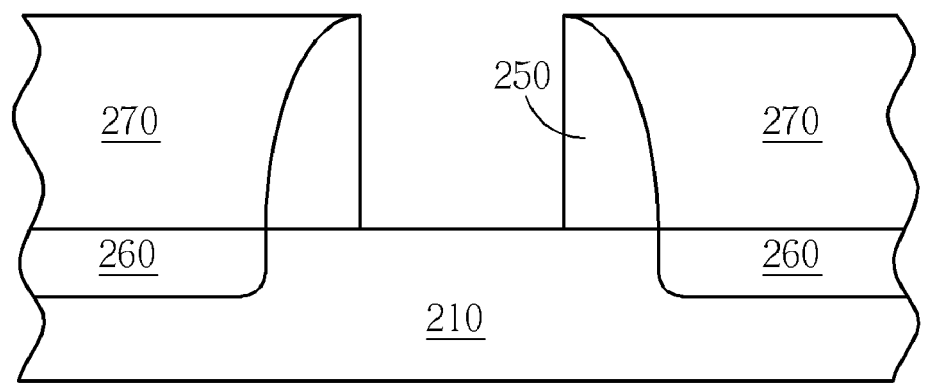
FIG. 4A schematically depicts a cross-sectional view of a MOS transistor process according to a third preferred embodiment of the present invention.
Figure 4B:
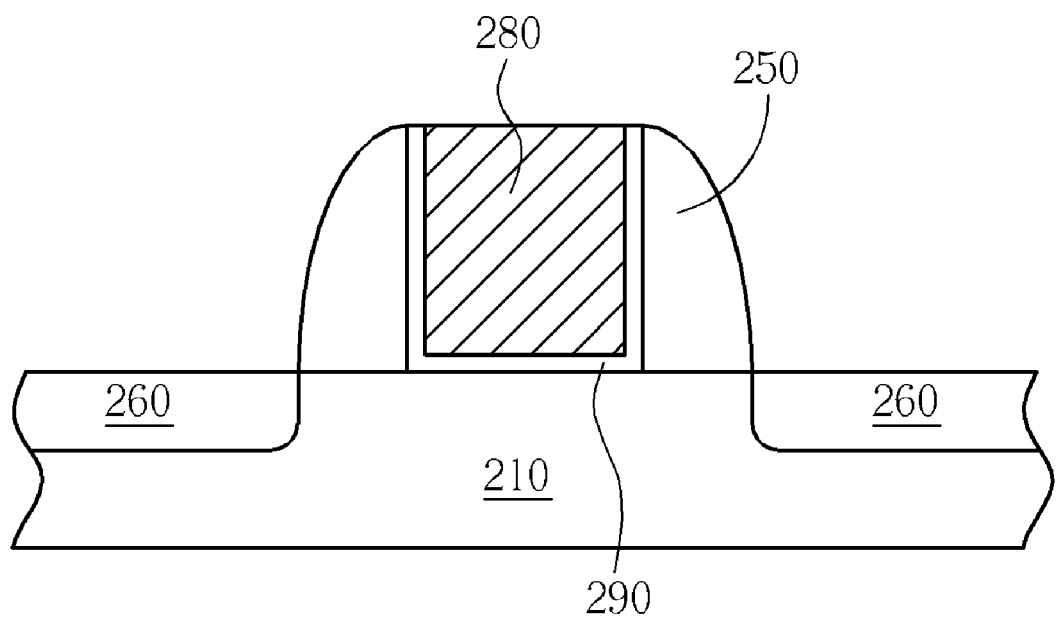
FIG. 4B schematically depicts a cross-sectional view of a MOS transistor process according to the third preferred embodiment of the present invention.

The present invention also provides a third embodiment MOS transistor applying the semiconductor process of this invention. Referring to FIG. 3A-3C and FIG. 4A-4B, the method of forming the third MOS transistor is similar to the method of forming the second MOS transistor. However, the difference is: the first step in the second embodiment (as shown in FIG. 3A) is to deposit a dielectric layer 220' having a high-k dielectric constant directly, but in this embodiment, a sacrificed dielectric layer, for instance a buffer layer or an interface layer made of materials with the characteristics of low cost, ease of etching and deposit, is deposited. Then, a silicon layer is deposited, a cap layer is deposited, a gate dielectric layer and a silicon gate electrode are etched, a spacer is formed, a source/drain region is formed, a dielectric layer is formed on the substrate, the cap layer and the spacer, and the cap layer is removed to expose the silicon gate electrode. Thereafter, as shown in FIG. 4A, the sacrificed gate dielectric layer and the silicon gate electrode are removed by various processes, for instance, etching processes. As shown in FIG. 4B, a gate dielectric layer 290 having a high-k dielectric constant including metal oxide and a metal electrode 280 sequentially fill in the recess. Therefore, compared with the second embodiment, the gate dielectric layer 290 and the work function metal layer (not shown) in this embodiment have a U-shaped cross-sectional structure and the damage to the gate dielectric layer 290 caused by the etching of the silicon gate electrode can be avoided. Likewise, a silicon epitaxial process may be selectively formed. A metal silicide, a contact etch stop layer (CESL), etc. may be formed on the source/drain region 260.

According to the above, the present invention provides a semiconductor process and three MOS transistor processes applying this semiconductor process, wherein the semiconductor process includes a dielectric layer having a high-k dielectric constant and the dielectric layer has a plurality of oxygen-related vacancies, which can easily trap charges, resulting in problems such as the increasing equivalent dielectric layer thickness. Therefore, the present invention provides an oxygen-importing process such as an oxygen-importing annealing process or an oxygen-implanting process etc. to fill the oxygen-related vacancies with oxygen, hence solving the aforementioned problems of increasing equivalent dielectric layer thickness, reducing the threshold voltage, and improving the electrical quality. Additionally, the present invention further provides a degas process performed before the oxygen-importing process to help remove gases and bonding, for instance vapor and hydrogen-oxygen bonding, that would reduce the performance of the semiconductor elements in the dielectric layer Those skilled in the art will readily observe that numerous modifications and alterations of the device and method may be made while retaining the teachings of the invention.

What is claimed is:

1. A semiconductor process having a dielectric layer including metal oxide, the process comprising:
   providing a substrate;
   forming the dielectric layer including metal oxide on the substrate, wherein the dielectric layer has a plurality of oxygen-related vacancies;
performing a degas process to the dielectric layer ; and
performing a first oxygen-importing process to the dielectric layer after the degas process to fill the oxygen-related vacancies with oxygen.

2. The semiconductor process according to claim 1, wherein the metal oxide comprises hafnium oxide and zirconium oxide.

3. The semiconductor process according to claim 1, wherein the dielectric layer further comprises a buffer layer.

4. The semiconductor process according to claim 3, wherein the buffer layer comprises a silicon dioxide layer and a silicon oxynitride layer.

5. The semiconductor process according to claim 3, wherein the buffer layer has a plurality of oxygen-related vacancies, and a second oxygen-importing process is further included in the semiconductor process to fill the oxygen-related vacancies with oxygen.

6. The semiconductor process according to claim 1, wherein the first oxygen-importing process is selected from the group comprising an oxygen-importing annealing process, an oxygen-implanting process, a chemical oxide removal process (COR) or a combination thereof.

7. The semiconductor process according to claim 6, wherein the annealing temperature of the oxygen-importing annealing process ranges between 400° C. and 500° C.

8. The semiconductor process according to claim 6, wherein the annealing temperature of the oxygen-importing annealing process is below 700° C.

9. The semiconductor process according to claim 6, wherein the oxygen concentration of the oxygen-importing annealing process ranges between 10% and 20%.

10. The semiconductor process according to claim 1, wherein the first oxygen-importing process comprises an oxygen-importing annealing process and an inert gas annealing process performed before the oxygen-importing annealing process, and wherein the inert gas annealing process comprises an ammonia-importing annealing process, a nitrogen-importing annealing process or an argon-importing annealing process.

11. The semiconductor process according to claim 10, wherein the annealing temperature of the inert gas annealing process ranges between 700° C. and 900° C.

12. A MOS transistor process, comprising:
providing a substrate;
forming a gate dielectric layer having a high-k dielectric constant on the substrate, wherein the gate dielectric layer has a plurality of oxygen-related vacancies;
performing a degas process to the gate dielectric layer;
performing a first oxygen-importing process to the gate dielectric layer after the degas process to fill the oxygen-related vacancies with oxygen; and
forming a metal gate on the gate dielectric layer.

13. The MOS transistor process according to claim 12, further comprising:
after the metal gate is formed, forming a spacer beside the gate dielectric layer and the metal gate; and
forming a source/drain region within the substrate next to the spacer.

14. The MOS transistor process according to claim 12, further comprising:
after the first oxygen-importing process is performed, forming a sacrificed gate structure on the gate dielectric layer;
forming a spacer beside the sacrificed gate structure and the gate dielectric layer;
forming a source/drain region within the substrate next to the spacer;
removing the sacrificed gate structure to form a recess; and
forming the metal gate in the recess.

15. The MOS transistor process according to claim 12, wherein the first oxygen-importing process comprises an oxygen-importing annealing process and an oxygen-implanting process.

16. A MOS transistor process, comprising:
providing a substrate;
forming a sacrificed gate structure on the substrate;
forming a spacer beside the sacrificed gate structure;
removing the sacrificed gate structure to form a recess;
filling a gate dielectric layer having a high-k dielectric constant in the recess, wherein the gate dielectric layer has a plurality of oxygen-related vacancies;
performing a degas process to the gate dielectric layer;
performing a first oxygen-importing process to the gate dielectric layer after the degas process to fill the oxygen-related vacancies with oxygen; and
filling a metal gate in the recess.

17. The MOS transistor process according to claim 16, wherein the first oxygen-importing process comprises an oxygen-importing annealing process and an oxygen-implanting process.

* * * * *